United States Patent
Liu et al.

(10) Patent No.: US 12,276,615 B1
(45) Date of Patent: Apr. 15, 2025

(54) DARK-FIELD CONFOCAL MICROSCOPY MEASUREMENT APPARATUS AND METHOD BASED ON MULTI-FRACTIONAL ANGULAR MOMENTUM DEMODULATION

(71) Applicant: Harbin Institute of Technology, Harbin (CN)

(72) Inventors: Jian Liu, Harbin (CN); Chenguang Liu, Harbin (CN); Zijie Hua, Harbin (CN); Kang Gu, Harbin (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 18/802,272

(22) Filed: Aug. 13, 2024

(30) Foreign Application Priority Data

Jul. 26, 2024 (CN) .......................... 202411010417.6

(51) Int. Cl.
*G01N 21/88* (2006.01)
*G01R 31/311* (2006.01)

(52) U.S. Cl.
CPC ....... *G01N 21/8806* (2013.01); *G01R 31/311* (2013.01); *G01N 2021/8822* (2013.01); *G01N 2021/8835* (2013.01); *G01N 2201/06113* (2013.01)

(58) Field of Classification Search
CPC ..... G01N 21/8806; G01N 2201/06113; G01N 2201/0675; G01N 2201/105; G01R 31/311
See application file for complete search history.

(56) References Cited

U.S. PATENT DOCUMENTS

| | | | |
|---|---|---|---|
| 7,271,889 B2* | 9/2007 | Cemic ................ | G01N 21/8806 356/237.2 |
| 11,742,173 B2* | 8/2023 | Den Hoedt .......... | H01J 37/226 250/307 |
| 11,921,042 B2* | 3/2024 | Sirat .................... | G02B 21/008 |
| 2016/0054225 A1* | 2/2016 | Fay, Jr. ................. | G02B 21/10 250/206 |

* cited by examiner

*Primary Examiner* — Hung V Nguyen
(74) *Attorney, Agent, or Firm* — Reising Ethington, P.C.

(57) ABSTRACT

This application relates to the technical field of confocal microscopy measurement, and provides a dark-field confocal microscopy measurement apparatus and method based on multi-fractional angular momentum demodulation. The apparatus includes a modulated illumination module and a signal collection and demodulation module. The modulated illumination module obtains vortex light with different fractional orders through modulation using vortex phase patterns with different fractional orders, so as to scan a to-be-measured sample. The vortex light with different fractional orders irradiates the to-be-measured sample and is reflected out. The signal collection and demodulation module collects the reflected light and generates dark-field images, and finally performs cross-correlation processing on the dark-field images generated under the vortex light with different fractional orders, to obtain high SNR data.

8 Claims, 3 Drawing Sheets

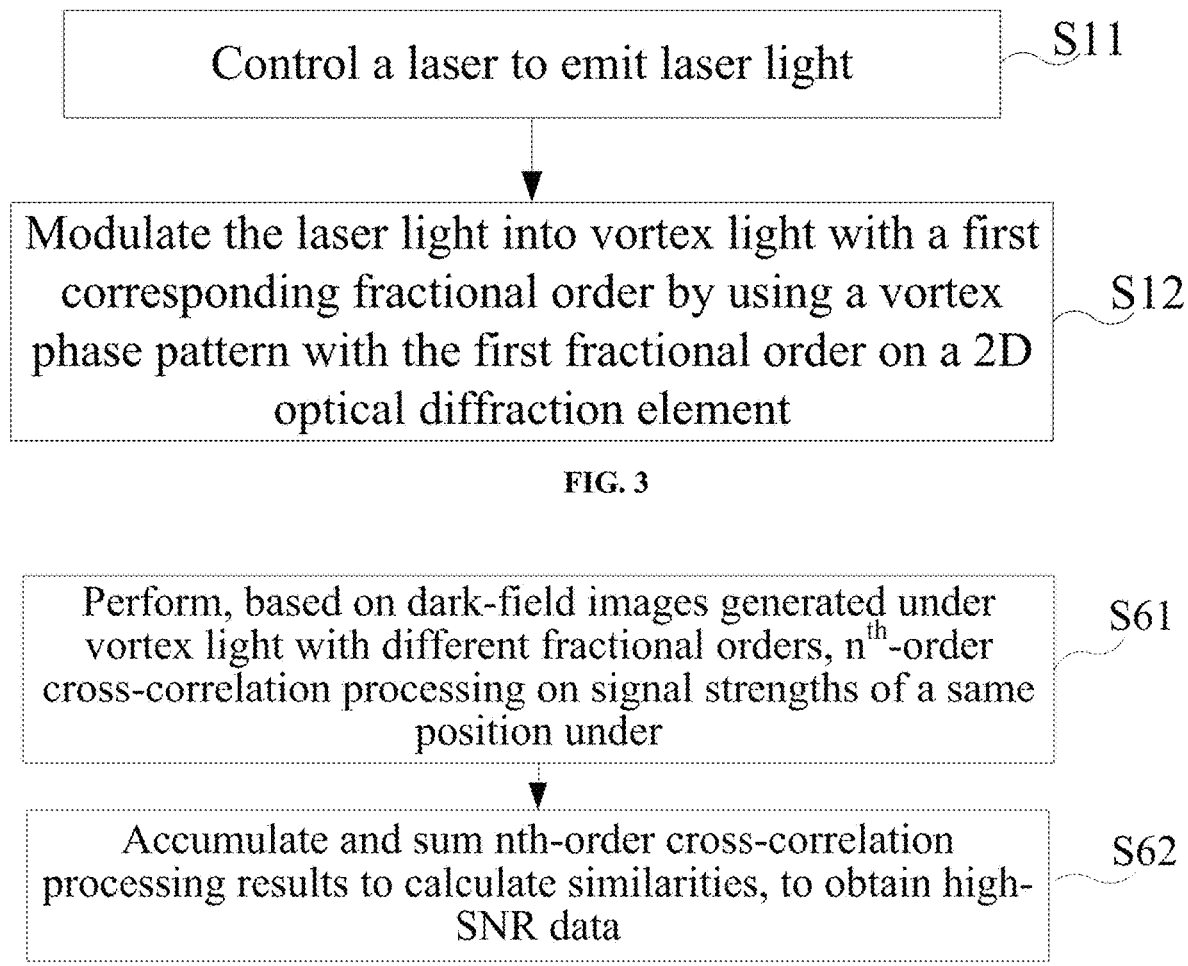

DARK-FIELD CONFOCAL MICROSCOPY MEASUREMENT APPARATUS AND METHOD BASED ON MULTI-FRACTIONAL ANGULAR MOMENTUM DEMODULATION

CROSS-REFERENCE TO RELATED APPLICATIONS

This patent application claims the benefit and priority of Chinese Patent Application No. 2024110104176, filed with the China National Intellectual Property Administration on Jul. 26, 2024, the disclosure of which is incorporated by reference herein in its entirety as part of the present application.

TECHNICAL FIELD

This application relates to the technical field of confocal microscopy measurement, and in particular to a dark-field confocal microscopy measurement apparatus and method based on multi-fractional angular momentum demodulation.

BACKGROUND OF THE INVENTION

Interlayer defects (such as holes and layer faults) in three-dimensional (3D) integrated circuits often degrade the electrical performance and lifespan. Detecting these interlayer defects is crucial for ensuring high product yield in semiconductor 3D integrated circuits. The confocal microscopy measurement technology is suitable for non-destructive defect detection in 3D integrated circuits due to its 3D sectioning capability.

The dark-field confocal microscopy measurement technology has become essential for non-destructive 3D defect detection in semiconductors due to advantages such as an excellent optical sectioning capability, high imaging resolution, and strong imaging contrast against a dark background. However, conventional optical dark-field confocal microscopy measurement technology exhibits a low response rate to micro-scale defects, and the detection sensitivity for nano-scale defects below 50 nm is inadequate. Factors such as the quality of the light source, ambient noise, and detector noise significantly affect the measurement precision and detection sensitivity of the dark-field confocal system. Therefore, improving the response rate, reducing imaging noise, and enhancing the sensitivity of dark-field confocal technology to enable a more comprehensive characterization of interlayer defects in 3D integrated circuits is a pressing concern for technicians in this field.

SUMMARY OF THE INVENTION

The purpose of this application is to provide a dark-field confocal microscopy measurement apparatus and method based on multi-fractional angular momentum demodulation, to enhance response rates, reduce imaging noise, and steadily improve dark-field confocal sensitivity.

To achieve the above objectives, this application provides the following technical solutions.

According to a first aspect, this application provides a dark-field confocal microscopy measurement apparatus based on multi-fractional angular momentum demodulation, including a modulated illumination module, a to-be-measured sample, a XYZ translation stage, and a signal collection and demodulation module.

The modulated illumination module is configured to obtain vortex light with different fractional orders through modulation using vortex phase patterns with different fractional orders, so as to scan the to-be-measured sample. The vortex light with different fractional orders irradiates the to-be-measured sample and is reflected out. The to-be-measured sample is fixed on the XYZ translation stage, and the XYZ translation stage is configured to drive the to-be-measured sample to move within a field of view of the modulated illumination module.

The signal collection and demodulation module is configured to: collect reflected light after the vortex light with different fractional orders irradiates the to-be-measured sample, and generate dark-field images, where the signal collection and demodulation module generates one dark-field image for the vortex light with any fractional order; and perform cross-correlation processing on the dark-field images generated under the vortex light with different fractional orders, to obtain high-signal-to-noise ratio (SNR) data.

According to a second aspect, this application provides a dark-field confocal microscopy measurement method based on multi-fractional angular momentum demodulation, including the following steps:

Laser light is modulated by using a vortex phase pattern with a first fractional order, to obtain vortex light corresponding to the first fractional order.

A to-be-measured sample is driven to move within a field of view of the vortex light, to complete scanning of the to-be-measured sample.

Light reflected by the to-be-measured sample is collected and a dark-field image is generated. One dark-field image is generated for the vortex light with any fractional order.

Whether the laser light has been modulated using vortex phase patterns with all fractional orders is determined, to obtain a first determining result.

If the first determining result is no, the laser light is modulated by using a vortex phase pattern with a next fractional order, to obtain vortex light corresponding to the fractional order, and the step of driving the to-be-measured sample to move within the field of view of the vortex light, to complete scanning of the to-be-measured sample is performed; and a plurality of dark-field images are obtained until the laser light has been modulated using the vortex phase patterns with all fractional orders.

If the first determining result is yes, cross-correlation processing is performed on the plurality of dark-field images, to obtain high SNR data.

According to the specific embodiments provided in this application, this application discloses the following technical effects:

This application provides a dark-field confocal microscopy measurement apparatus and method based on multi-fractional angular momentum demodulation. The apparatus includes a modulated illumination module, a to-be-measured sample, a XYZ translation stage, and a signal collection and demodulation module. The modulated illumination module obtains vortex light with different fractional orders through modulation using vortex phase patterns with different fractional orders, so as to scan a to-be-measured sample. The vortex light with different fractional orders irradiates the to-be-measured sample and is reflected out. The signal collection and demodulation module collects reflected light after the vortex light with different fractional orders irradiates the to-be-measured sample, and generates dark-field images. One dark-field image is generated for the vortex light with any fractional order. Finally, cross-correlation processing is performed on the dark-field images generated under the vortex light with different fractional orders, to obtain high SNR data. With the apparatus provided in this application, the sample is illuminated by the vortex light with different fractional orders, for dark-field detection. This enables simultaneous acquisition of defect responses to the multi-order vortex components, enhancing signal intensity for minute defects. Furthermore, employing the cross-correlation algorithm effectively suppresses common-mode noise, thereby highlighting subtle information related to nano-scale defects. This enhances response rates, reduces imaging noise, and steadily improves defect detection sensitivity, enabling a more comprehensive characterization of interlayer defects in 3D integrated circuits.

BRIEF DESCRIPTION OF DRAWINGS

To describe the technical solutions in the examples of this application or in the prior art more clearly, the following briefly describes the accompanying drawings required for the examples. Apparently, the accompanying drawings in the following description show merely some examples of this application, and a person of ordinary skill in the art may still derive other accompanying drawings from these accompanying drawings without creative efforts.

FIG. 3 is a schematic flowchart of a step S1 in a dark-field confocal microscopy measurement method based on multi-fractional angular momentum demodulation according to an embodiment of this application; and FIG. 4 is a schematic flowchart of a step S6 in a dark-field confocal microscopy measurement method based on multi-fractional angular momentum demodulation according to an embodiment of this application.

Figure 1:
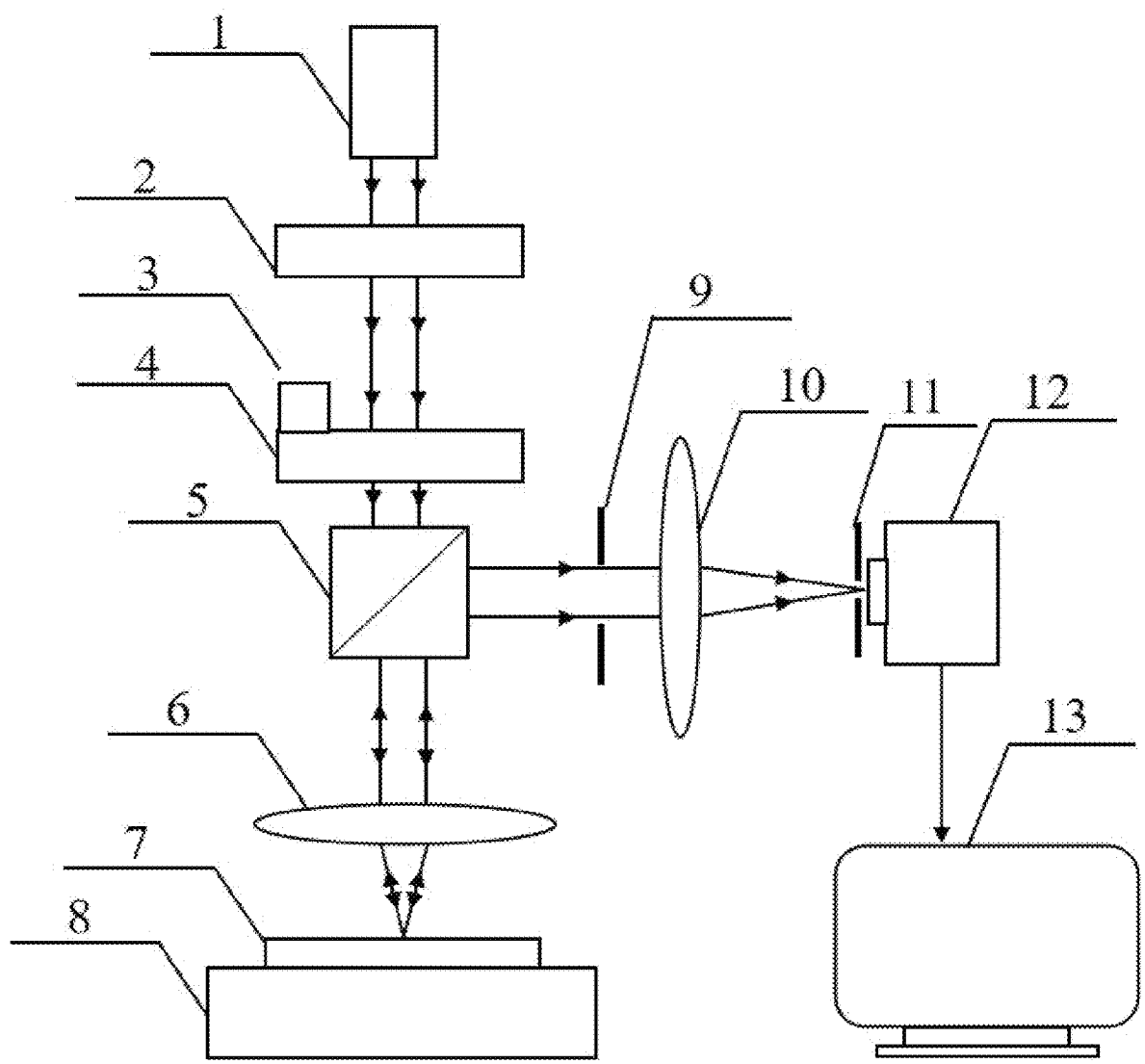
FIG. 1 is a schematic structural diagram of a dark-field confocal microscopy measurement apparatus based on multi-fractional angular momentum demodulation according to an embodiment of this application.

REFERENCE NUMERALS 1-laser; 2-2D optical diffraction element; 3-turntable; 4-beam expander; 5-non-polarizing beam splitter; 6-objective lens; 7-to-be-measured sample; 8-XYZ translation stage; 9-diaphragm; 10-focusing lens; 11-pinhole; 12-photoelectric detector; and 13-industrial computer.

DETAILED DESCRIPTION OF THE INVENTION

The technical solutions in embodiments of the present application are described below clearly and completely with reference to the drawings in the embodiments of the present application. Apparently, the described embodiments are merely part rather than all of the embodiments of the present application. All other embodiments obtained by those of ordinary skill in the art based on the embodiments of the present application without creative efforts should fall within the protection scope of the present application.

To make the above objectives, features, and advantages of this application more obvious and easy to understand, the present disclosure will be further described in detail with reference to the accompanying drawings and specific implementations.

In an exemplary embodiment, as shown in FIG. 1, a dark-field confocal microscopy measurement apparatus based on multi-fractional angular momentum demodulation is provided, including a modulated illumination module, a to-be-measured sample 7, a XYZ translation stage 8, and a signal collection and demodulation module. The to-be-measured sample 7 is placed on the XYZ translation stage 8, and vortex light emitted by the modulated illumination module irradiates the to-be-measured sample 7, and reflected light is collected and processed by the signal collection and demodulation module.

The modulated illumination module is configured to obtain vortex light with different fractional orders through modulation using vortex phase patterns with different fractional orders, so as to scan the to-be-measured sample 7. The vortex light with different fractional orders irradiates the to-be-measured sample 7 and is reflected out. The to-be-measured sample 7 is fixed on the XYZ translation stage 8, and the XYZ translation stage 8 is configured to drive the to-be-measured sample 7 to move within a field of view of the modulated illumination module.

The signal collection and demodulation module is configured to: collect reflected light after the vortex light with different fractional orders irradiates the to-be-measured sample 7, and generate dark-field images, where the signal collection and demodulation module generates one dark-field image for the vortex light with any fractional order; and perform cross-correlation processing on the dark-field images generated under the vortex light with different fractional orders, to obtain high-SNR data. In a specific embodiment, the modulated illumination module includes a laser 1, a 2D optical diffraction element 2, a turntable 3, and a beam expander 4. The laser light emitted by the laser 1 enters the signal collection and demodulation module via the 2D optical diffraction element 2, the turntable 3, and the beam expander 4. Specifically, the 2D optical diffraction element 2 is etched with a plurality of vortex phase patterns with different fractional orders in a circular arrangement; the laser 1 is configured to emit laser light; the 2D optical diffraction element 2 is configured to modulate the laser light using the vortex phase pattern with any fractional order, to produce the vortex light of a corresponding fractional order; the turntable 3 is configured to rotate the 2D optical diffraction element 2, to enable the 2D optical diffraction element 2 to modulate the laser light using the vortex phase patterns with different fractional orders; and the beam expander 4 is configured to expand and output the vortex light.

In a preferred embodiment, phase differences between the vortex phase patterns etched on the 2D optical diffraction element 2 satisfy arithmetic progression. Among the plurality of vortex phase patterns etched on the 2D optical diffraction element 2, a minimum phase is greater than 0.5 and a maximum phase is less than 1.5.

In this embodiment, among the plurality of vortex phase patterns etched on the 2D optical diffraction element 2, a fractional-order difference between two adjacent vortex phase patterns is 0.05-0.1.

In a specific embodiment, the signal collection and demodulation module includes a non-polarizing beam splitter 5, an objective lens 6, a diaphragm 9, a focusing lens 10, a pinhole 11, a photoelectric detector 12, and an industrial computer 13. Illumination light is emitted from the modulated illumination module, passes through the non-polarizing beam splitter 5 and the objective lens 6, and irradiates the sample 7. The reflected light passes through the diaphragm 9, and is focused by the focusing lens 10 onto the photoelectric detector 12 through the pinhole 11. The photoelectric detector 12 converts the light signal into an electrical signal to generate a pixel image and transmits the image to the industrial computer 13. Specifically, the non-polarizing beam splitter 5 is configured to enable the vortex light with different fractional orders output by the modulated illumination module to pass through the objective lens 6 and irradiate the to-be-measured sample 7, receive light reflected by the to-be-measured sample 7 and passing through the objective lens 6, and transmit the reflected light to the photoelectric detector 12 through the diaphragm 9, the focusing lens 10, and the pinhole 11; the photoelectric detector 12 is configured to convert the reflected light into an electrical signal, generate the dark-field image, and send the dark-field image to the industrial computer 13; the industrial computer 13 is configured to perform, based on the dark-field images generated under the vortex light with different fractional orders, $n^{th}$-order cross-correlation processing on signal strengths of a same position under illumination of the vortex light with different fractional orders, accumulate and sum $n^{th}$-order cross-correlation processing results to calculate similarities, to obtain the high-SNR data.

In a preferred embodiment, a size of the diaphragm 9 matches a diameter of a central dark spot of a beam output after being expanded by the beam expander 4, to retain only a central scattered signal.

With the apparatus provided in the above embodiment, the sample is illuminated by the vortex light with different fractional orders, for dark-field detection. This enables simultaneous acquisition of defect responses to multi-order vortex components, enhancing signal intensity for minute defects. Furthermore, employing the cross-correlation algorithm effectively suppresses common-mode noise, thereby highlighting subtle information related to nano-scale defects. This enhances response rates, reduces imaging noise, and steadily improves defect detection sensitivity, enabling a more comprehensive characterization of interlayer defects in 3D integrated circuits.

Based on the same inventive concept, the embodiments of this application further provide a dark-field confocal microscopy measurement method applied to the above dark-field confocal microscopy measurement apparatus based on multi-fractional angular momentum demodulation. The solution provided by this method is similar to that described in the above apparatus. For specific limitations on the one or more method embodiments provided below, reference may be made to the limitations on the above dark-field confocal microscopy measurement apparatus based on multi-fractional angular momentum demodulation. Details are not described herein again.

Figure 2:
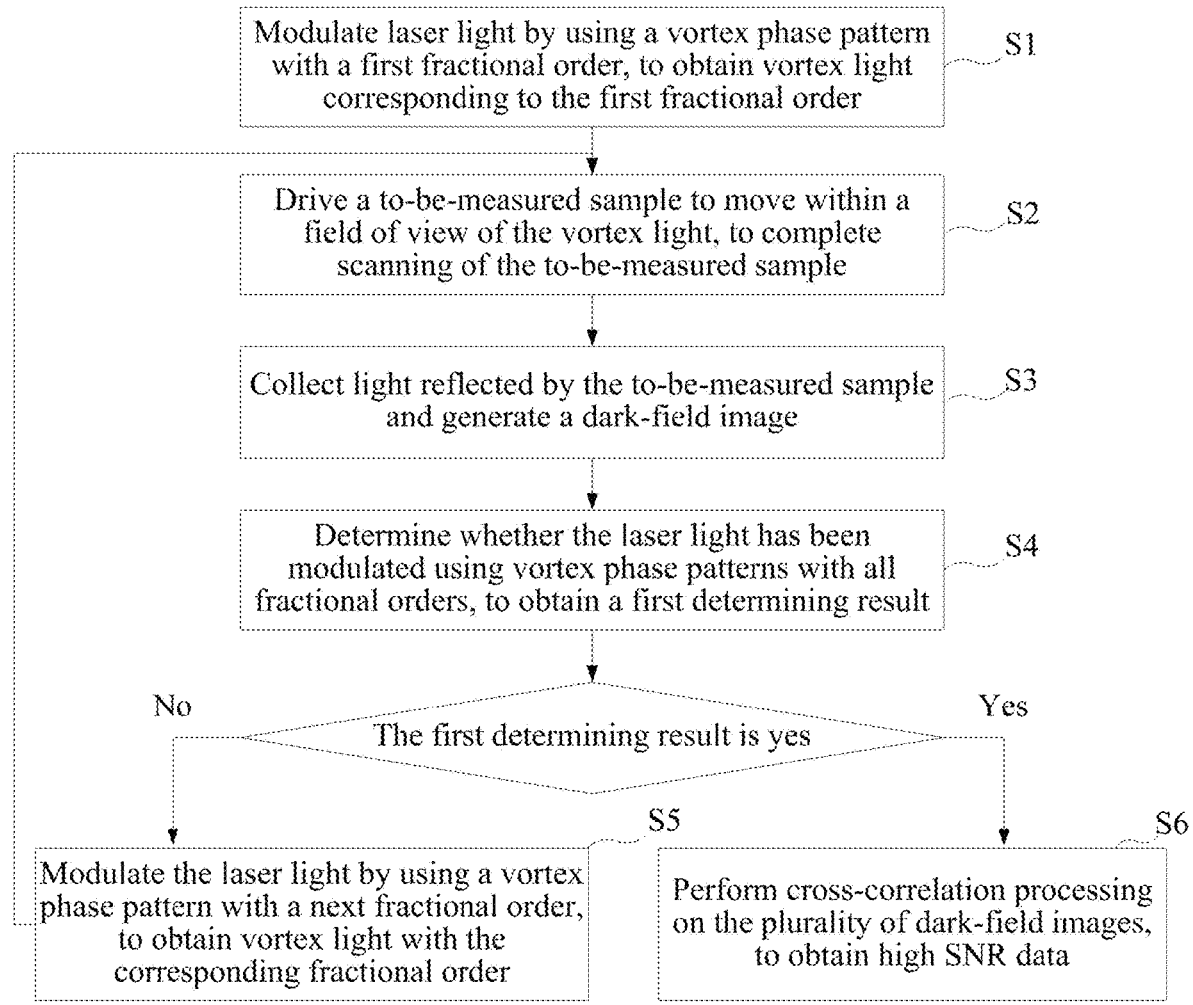
FIG. 2 is a schematic flowchart of a dark-field confocal microscopy measurement method based on multi-fractional angular momentum demodulation according to an embodiment of this application.

In an exemplary embodiment, as shown in FIG. 2, a dark-field confocal microscopy measurement method based on multi-fractional angular momentum demodulation is provided, which is executed by a computer device and includes the following steps S1 to S6:

S1: Modulate laser light by using a vortex phase pattern with a first fractional order, to obtain vortex light corresponding to the first fractional order. As shown in the flowchart in FIG. 3, step S1 specifically includes the following steps:

S11: Control a laser to emit laser light.

S12: Modulate the laser light into the vortex light with the first corresponding fractional order by using the vortex phase pattern with the first fractional order on a 2D optical diffraction element, where the 2D optical diffraction element is etched with a plurality of vortex phase patterns with different fractional orders in a circular arrangement.

S2: Drive a to-be-measured sample to move within a field of view of the vortex light, to complete scanning of the to-be-measured sample.

S3: Collect light reflected by the to-be-measured sample and generate a dark-field image, where one dark-field image is generated for the vortex light with any fractional order.

S4: Determine whether the laser light has been modulated using vortex phase patterns with all fractional orders, to obtain a first determining result. If the first determining result is no, proceed to step S5; otherwise, proceed to step S6.

S5: Modulate the laser light by using a vortex phase pattern with a next fractional order, to obtain vortex light corresponding to the fractional order, and proceed to the step S2; and obtain a plurality of dark-field images until the laser light has been modulated using the vortex phase patterns with all fractional orders. Specifically, in this embodiment, the step S5 includes: rotating the 2D optical diffraction element with a turntable, and modulating the laser light by using the vortex phase pattern with the next fractional order on the 2D optical diffraction element.

S6: Perform cross-correlation processing on the plurality of dark-field images, to obtain high SNR data. As shown in the flowchart in FIG. 4, the step S6 specifically includes the following steps:

S61: Perform, based on the dark-field images generated under the vortex light with different fractional orders, $n^{th}$-order cross-correlation processing on signal strengths of a same position under illumination of the vortex light with different fractional orders.

S62: Accumulate and sum $n^{th}$-order cross-correlation processing results to calculate similarities, to obtain the high-SNR data. Assuming that the sample is stationary under different angles of illumination, the specificity of the sample with different angles of illumination can be expressed as formula (1):

$$\delta F(r,l) = F(r,l) - \langle (F(r,l)) \rangle \quad (1)$$

$\delta F$ is the difference between the signal intensity under a certain order and the average signal intensity under multiple orders, r is the spatial coordinate, and/is the order of vortex light. The $n^{th}$-order cross-correlation calculation formula can be expressed by formula (2):

$$G_n(r, l_1, \ldots, l_{n-1}) = \langle (\delta F(r,l_1) \delta F(r,l_2) \ldots \delta F(r,l_{n-1}) \rangle_l \quad (2)$$

$G_{n(\ )}$ indicates the $n^{th}$-order cross-correlation vale, n indicates the cross-correlation order, $l_{n-1}$ indicates the $(n-1)^{th}$ order of the vortex light, and $<,,>_l$ indicates the average signal intensity under illumination of vortex light with different orders.

According to the method provided in the above embodiments, the sample is illuminated by the vortex light with different fractional orders, for dark-field detection. This enables simultaneous acquisition of defect responses to multi-order vortex components, enhancing signal intensity for minute defects. Furthermore, employing the cross-correlation algorithm effectively suppresses common-mode noise, thereby highlighting subtle information related to nano-scale defects. This enhances response rates, reduces imaging noise, and steadily improves defect detection sensitivity, enabling a more comprehensive characterization of interlayer defects in 3D integrated circuits.

The technical characteristics of the above embodiments can be employed in arbitrary combinations. To provide a concise description of these embodiments, all possible combinations of all the technical characteristics of the above embodiments may not be described; however, these combinations of the technical characteristics should be construed as falling within the scope defined by the specification as long as no contradiction occurs.

Several examples are used herein for illustration of the principles and implementations of this application. The description of the foregoing examples is used to help illustrate the method of this application and the core principles thereof. In addition, those of ordinary skill in the art can make various modifications in terms of specific implementations and scope of application in accordance with the teachings of this application. In conclusion, the content of the present specification shall not be construed as a limitation to this application.

The invention claimed is:

1. A dark-field confocal microscopy measurement apparatus based on multi-fractional angular momentum demodulation, comprising a modulated illumination module, a to-be-measured sample, a XYZ translation stage, and a signal collection and demodulation module, wherein the modulated illumination module is configured to obtain vortex light with different fractional orders through modulation using vortex phase patterns with different fractional orders, so as to scan the to-be-measured sample, wherein the vortex light with different fractional orders irradiates the to-be-measured sample and is reflected out; the to-be-measured sample is fixed on the XYZ translation stage, and the XYZ translation stage is configured to drive the to-be-measured sample to move within a field of view of the modulated illumination module; and the signal collection and demodulation module is configured to: collect reflected light after the vortex light with different fractional orders irradiates the to-be-measured sample, and generate dark-field images, wherein the signal collection and demodulation module generates one dark-field image for the vortex light with any fractional order; and perform cross-correlation processing on the dark-field images generated under the vortex light with different fractional orders, to obtain high-signal-to-noise ratio (SNR) data;

wherein the modulated illumination module comprises: a laser, a two-dimensional (2D) optical diffraction element, a turntable, and a beam expander; the 2D optical diffraction element is etched with a plurality of vortex phase patterns with different fractional orders in a circular arrangement; the laser is configured to emit laser light; the 2D optical diffraction element is configured to modulate the laser light using the vortex phase pattern with any fractional order, to produce vortex light of a corresponding fractional order; the turntable is configured to rotate the 2D optical diffraction element, to enable the 2D optical diffraction element to modulate the laser light using the vortex phase patterns with different fractional orders; and the beam expander is configured to expand and output the vortex light.

2. The dark-field confocal microscopy measurement apparatus based on multi-fractional angular momentum demodulation according to claim 1, wherein phase differences between the vortex phase patterns etched on the 2D optical diffraction element satisfy arithmetic progression.

3. The dark-field confocal microscopy measurement apparatus based on multi-fractional angular momentum demodulation according to claim 2, wherein among the plurality of vortex phase patterns etched on the 2D optical diffraction element, a minimum phase is greater than 0.5 and a maximum phase is less than 1.5.

4. The dark-field confocal microscopy measurement apparatus based on multi-fractional angular momentum demodulation according to claim 2, wherein among the plurality of vortex phase patterns etched on the 2D optical diffraction element, a fractional-order difference between two adjacent vortex phase patterns is 0.05-0.1.

5. The dark-field confocal microscopy measurement apparatus based on multi-fractional angular momentum demodulation according to claim 1, wherein the signal collection and demodulation module comprises: a non-polarizing beam splitter, an objective lens, a diaphragm, a focusing lens, a pinhole, a photoelectric detector, and an industrial computer; the non-polarizing beam splitter is configured to enable the vortex light with different fractional orders output by the modulated illumination module to pass through the objective lens and irradiate the to-be-measured sample, receive light reflected by the to-be-measured sample and passing through the objective lens, and transmit the reflected light to the photoelectric detector through the diaphragm, the focusing lens, and the pinhole; the photoelectric detector is configured to convert the reflected light into an electrical signal, generate the dark-field image, and send the dark-field image to the industrial computer; the industrial computer is configured to perform, based on the dark-field images generated under the vortex light with different fractional orders, $n^{th}$-order cross-correlation processing on signal strengths of a same position under illumination of the vortex light with different fractional orders, and accumulate and sum $n^{th}$-order cross-correlation processing results to calculate similarities, to obtain the high-SNR data.

6. The dark-field confocal microscopy measurement apparatus based on multi-fractional angular momentum demodulation according to claim 5, wherein a size of the diaphragm matches a diameter of a central dark spot of a beam output after being expanded by the beam expander, to retain only a central scattered signal.

7. A dark-field confocal microscopy measurement method based on multi-fractional angular momentum demodulation, comprising:

modulating laser light by using a vortex phase pattern with a first fractional order, to obtain vortex light corresponding to the first fractional order;

driving a to-be-measured sample to move within a field of view of the vortex light, to complete scanning of the to-be-measured sample;

collecting light reflected by the to-be-measured sample and generating a dark-field image, wherein one dark-field image is generated for the vortex light with any fractional order;

determining whether the laser light has been modulated using vortex phase patterns with all fractional orders, to obtain a first determining result; and if the first determining result is no, modulating the laser light by using a vortex phase pattern with a next fractional order, to obtain vortex light corresponding to the fractional order, and proceeding to the step of driving the to-be-measured sample to move within the field of view of the vortex light, to complete scanning of the to-be-measured sample; and obtaining a plurality of dark-field images until the laser light has been modulated using the vortex phase patterns with all fractional orders; or if the first determining result is yes, performing cross-correlation processing on the plurality of dark-field images, to obtain high-signal-to-noise ratio (SNR) data;

wherein said modulating laser light by using a vortex phase pattern with a first fractional order, to obtain vortex light corresponding to the first fractional order specifically comprises:

controlling a laser to emit laser light; and modulating the laser light into the vortex light with the first corresponding fractional order by using the vortex phase pattern with the first fractional order on a two-dimensional (2D) optical diffraction element, wherein the 2D optical diffraction element is etched with a plurality of vortex phase patterns with different fractional orders in a circular arrangement; and said modulating the laser light by using a vortex phase pattern with a next fractional order, to obtain vortex light corresponding to the fractional order specifically comprises:

rotating the 2D optical diffraction element with a turntable, and modulating the laser light by using the vortex phase pattern with the next fractional order on the 2D optical diffraction element.

8. The dark-field confocal microscopy measurement apparatus based on multi-fractional angular momentum demodulation according to claim 7, wherein said performing cross-correlation processing on the plurality of dark-field images, to obtain high-SNR data specifically comprises:

performing, based on the dark-field images generated under the vortex light with different fractional orders, $n^{th}$-order cross-correlation processing on signal strengths of a same position under illumination of the vortex light with different fractional orders; and accumulating and summing $n^{th}$-order cross-correlation processing results to calculate similarities, to obtain the high-SNR data.

* * * * *